(12) United States Patent
Kinoshita et al.

(10) Patent No.: US 6,455,784 B1
(45) Date of Patent: Sep. 24, 2002

(54) CURABLE SHEET FOR CIRCUIT TRANSFER

(75) Inventors: Shozo Kinoshita, Kawasaki (JP);
Masaki Yamamoto, Yokohama (JP);
Katsura Hayashi, Kokubu (JP);
Masaaki Hori, Kokubu (JP);
Toshikazu Fujii, Kokubu (JP)

(73) Assignees: Asahi Kasei Kabushiki Kaisha (JP);
Kyocera Corporation (JP)

( * ) Notice: Subject to any disclaimer, the term of this patent is extended or adjusted under 35 U.S.C. 154(b) by 0 days.

(21) Appl. No.: 09/698,319

(22) Filed: Oct. 27, 2000

(30) Foreign Application Priority Data

Oct. 27, 1999 (JP) ............................. 11-305023
Oct. 28, 1999 (JP) ............................. 11-306200

(51) Int. Cl.[7] ................................ H05K 1/09
(52) U.S. Cl. .................. 174/257; 428/209; 174/255; 174/262
(58) Field of Search ................. 174/255, 256, 174/257, 258, 259, 262–265; 428/920, 921, 327, 209

(56) References Cited

U.S. PATENT DOCUMENTS

| 2,692,190 A | | 10/1954 | Pritikin |
|---|---|---|---|
| 4,869,767 A | | 9/1989 | Robinson et al. |
| 4,937,132 A | * | 6/1990 | Gaku et al. ................. 428/209 |
| 5,266,385 A | * | 11/1993 | Ishii et al. .................. 428/209 |
| 5,625,000 A | * | 4/1997 | Fututa et al. ................ 525/68 |
| 5,744,758 A | | 4/1998 | Takenouchi et al. |

FOREIGN PATENT DOCUMENTS

JP  7-247417 A  9/1995

* cited by examiner

*Primary Examiner*—Kamand Cuneo
(74) *Attorney, Agent, or Firm*—Pennie & Edmonds LLP

(57) ABSTRACT

Provided is a curable sheet for the formation of a wiring circuit layer by circuit transfer from a transfer base material, wherein the curable sheet comprises (A) a reaction product between a polyphenylene ether resin and an unsaturated carboxylic acid or acid anhydride, (B) triallyl isocyanurate and/or triallyl cyanurate, (C) a hydrogenated block copolymer obtained by hydrogenation of a block copolymer comprising at least one polymer block A mainly comprising an aromatic vinyl compound and at least one polymer block B mainly comprising a conjugated diene compound, and (D) an inorganic filler; said Component (A), Component (B) and Component (C) being contained in amounts of 45 to 55 parts by weight, 55 to 45 parts by weight, and 25 to 35 parts by weight, respectively, each based on 100 parts by weight of total of Components (A) and (B), and said Component (C) being contained in an amount of 20 to 80 vol. %.

6 Claims, 3 Drawing Sheets

(c)

(d)

(e)

(f)

CURABLE SHEET FOR CIRCUIT TRANSFER

FIELD OF THE INVENTION

The present invention relates to a curable sheet to be used for the formation of a wiring circuit layer by the transfer from a transfer base material, and to a multilayer wiring board using a cured sheet as an insulating layer, which has been obtained by curing the above-described curable sheet, for example, a multilayer wiring board suitable for use as a semiconductor device package. The present invention also relates to a process for producing the above-described multilayer wiring board.

RELATED ART OF THE INVENTION

As a wiring board, for example, a multilayer wiring board used as a semiconductor device package, a multilayer printed wiring board produced by adhering a copper foil onto the surface of each of insulating substrates including a resin, etching the copper foil to form a minute circuit and then stacking the resulting substrates one on top of the other has been proposed conventionally and employed in practice. Recently, there is a demand for the development of a multilayer printed wiring board having a more precise and high-density circuit. The conventional multilayer printed wiring board however cannot satisfy such a demand because in such a wiring board, interlayer connection is attained by plating inside of a thorough-hole formed to penetrate through a substrate so that this through-hole imposes a limitation on circuit designing and makes it difficult to accomplish high-density interconnection. Recently developed with a view to satisfy such a demand is a so-called build-up process, wherein insulating layers and wiring circuit layers are alternately formed by coating of the insulating layer, plating or via-hole formation over a predetermined substrate surface to effect multilayer lamination.

In this build-up process, however, layers are formed not simultaneously but successively so that a yield of the finished product corresponds to the multiplication product of the yields of successively formed layers, making it essentially difficult to heighten the yield. In addition, a build-up substrate using a photosensitive resin is accompanied with the problem that introduction of a photosensitive group into the resin lowers heat resistance or water absorption resistance of the substrate, which makes it impossible to satisfy the performances required for it in near future as a semiconductor device package.

In recent years, a thermosetting polyphenylene ether resin having high heat resistance and excellent water absorption resistance has drawn attentions and its application to a multilayer printed wiring board has been tried.

SUMMARY OF THE INVENTION

An object of the present invention is to provide a curable sheet for circuit transfer which comprises a thermosetting polyphenylene ether resin composition, permits formation of a precise and high-density circuit with a high productivity, and is excellent in heat resistance and water absorption resistance; and moreover to provide a curable sheet which can be used for a multilayer wiring board having long term stability under a high temperature shelf test at 130° C. or higher.

Another object of-the present invention is to provide a multilayer wiring board produced using the above-described curable sheet.

A further other object of the present invention is to provide a process for producing the above-described multilayer wiring board.

Other objects and effects of the invention will become more apparent from the following description.

As a result of the extensive investigation on the above-described objects, the present inventors found that by transferring a wiring circuit to a curable sheet for circuit transfer, which contains a thermosetting polyphenylene ether resin composition having a specific composition, from a transfer base material, curable insulating layers stacked one after another can be cured in one step, leading to simplification of the multiplayer lamination, and that the conductor resistance varies largely not only by the penetration of oxygen or moisture from the outer circumstances, which has so far been considered as its cause, but also by impurities contained in a brominated flame retardant, thus leading to the completion of the invention.

The above-described objects of the invention have therefore been achieved by providing the following curable sheets, multilayer wiring boards and processes for producing a multilayer wiring board.

1. A curable sheet for the formation of a wiring circuit layer by circuit transfer from a transfer base material, which sheet comprises a thermosetting polyphenylene ether resin composition comprising:

(A) a reaction product between a polyphenylene ether resin and an unsaturated carboxylic acid or acid anhydride;

(B) triallyl isocyanurate and/or triallyl cyanurate;

(C) a hydrogenated block copolymer obtained by hydrogenation of a block copolymer having at least one polymer block A mainly comprising an aromatic vinyl compound and at least one polymer block B mainly comprising a conjugated diene compound; and (D) an inorganic filler, said composition containing 45 to 55 parts by weight of Component (A), 55 to 45 parts by weight of Component (B) and 25 to 35 parts by weight of Component (C), each based on 100 parts by weight of the total of Components (A) and (B), and containing 20 to 80 vol. % of Component (D).

2. The curable sheet according to the above item 1, wherein the thermosetting polyphenylene ether resin composition further comprises (E) a brominated flame retardant in an amount of 10 to 30 parts by weight based on 100 parts by weight of the total of Components (A) and (B) and the brominated flame retardant (E) contains, as impurities, sodium bromide (NaBr) and bromine ($Br_2$) at a weight ratio of 50 ppm or less and 100 ppm or less, respectively.

3. A multilayer wiring board comprising a resin-containing insulating layer and a wiring circuit layer disposed on the surface and/or inside of the insulating layer, wherein said insulating layer is obtained by curing a curable sheet according to the above item 1 or 2 and at least a part of the wiring circuit layer is formed by transfer from a transfer base material having thereon a wiring circuit layer comprising a metal foil.

4. The multilayer wiring board according to the above item 3, which further comprises a via-hole conductor for electrically connecting adjacent wiring circuit layers, wherein the via-hole conductor is formed by filling a conductive paste in a through-hole, and wherein a wiring circuit layer comprising a metal foil having a thickness of at least 0.05 time the thickness of the insulating layer is embedded in the insulating layer.

5. The multilayer wiring board according to the above item 3, which has, inside thereof, an inner layer comprising: a cured composite material layer obtained by impregnating reinforced fibers with a polyphenylene ether resin composition comprising (A) a reaction product between a polyphenylene ether resin, and an unsaturated carboxylic acid or acid anhydride and (B) triallyl isocyanurate and/or triallyl cyanurate, the contents of Components (A) and (B) being 45 to 55 parts by weight and 55 to 45 parts by weight, respectively, each based on 100 parts by weight of the total of Components (A) and (B); and a wiring circuit layer at least a part of which is formed by transfer from a transfer base material having thereon a wiring circuit layer comprising a metal foil.

6. The multilayer wiring board according to the above item 5, which further comprises a via-hole conductor for electrically connecting adjacent wiring circuit layers, wherein said via-hole conductor is formed by filling a conductive paste in a through-hole, and wherein a wiring circuit layer comprising a metal foil having a thickness of at least 0.05 time the thickness of the insulating layer is embedded in each of the insulating layer and cured complex material layer.

7. A process for producing a multilayer wiring board, which comprises:

(a) forming a wiring circuit layer on a surface of a transfer base material;

(b) forming a via-hole conductor by making a through-hole in a curable sheet according to the above item 1 or 2 and filling a conductive paste in the through-hole;

(c) stacking the resulting curable sheet, with the via-hole conductor formed therein, over the transfer base material having thereon the wiring circuit layer, and bonding them under pressure, thereby forming an insulating layer;

(d) releasing the transfer base material from the surface of the insulating layer obtained in step (c) and transferring the wiring circuit layer on the surface of the transfer base material to the surface of the insulating layer; and (e) stacking a plurality of the insulating layers obtained through the steps (a) to (d) one after another and curing the resin simultaneously by heating and pressurizing means.

8. A process for producing a multilayer wiring board, which comprises: preparing an inner layer which comprises a curable composite material layer obtained by impregnating reinforced fibers with a polyphenylene ether resin composition comprising (A) a reaction product between a polyphenylene ether resin and an unsaturated carboxylic acid or acid anhydride and (B) triallyl isocyanurate and/or triallyl cyanurate, the contents of Components (A) and (B) being 45 to 55 parts by weight and 55 to 45 parts by weight, respectively, each based on 100 parts by weight of the total of Components (A) and (B), followed by drying, and a wiring circuit layer at least a part of which is formed by circuit transfer from a transfer base material having thereon a wiring circuit layer comprising a metal foil; stacking, over an outer surface of the inner layer, insulating layers which have a wiring circuit layer formed thereon and which is obtained through the steps (a) to (d) of the production process of a multilayer wiring board according to yjr above item 7; and curing the resin simultaneously.

The present invention is based on the finding that a plurality of curable insulating layers stacked one after another can be cured simultaneously by forming a wiring circuit layer on a curable sheet for circuit transfer, which comprises a thermosetting polyphenylene ether resin composition having a specific composition, by transferring thereto the wiring circuit layer from a transfer base material and this enables simplification of the lamination step. It has been understood that in order to produce a multilayer wiring board by this transfer process in a high yield, an insulating resin composition to be employed for it should have various properties as described below:

(1) adhesion for facilitating circuit transfer, (2) melt properties for retaining the position of a circuit upon curing a substrate under pressure, (3) handling properties of an uncured sheet, and (4) processability for facilitating the processing of an electrically connecting through-hole.

Use of the curable sheet of the invention comprising a thermosetting polyphenylene ether resin composition having a specific composition makes it possible to provide a curable resin sheet which satisfies all of the adhesion, melt properties, handling properties and processability. Moreover, use of this curable resin sheet enables simultaneous stacking and curing of curable insulating layers, thereby simplifying the step for the formation of a multilayer structure.

DETAILED DESCRIPTION OF THE INVENTION

Figure 1:
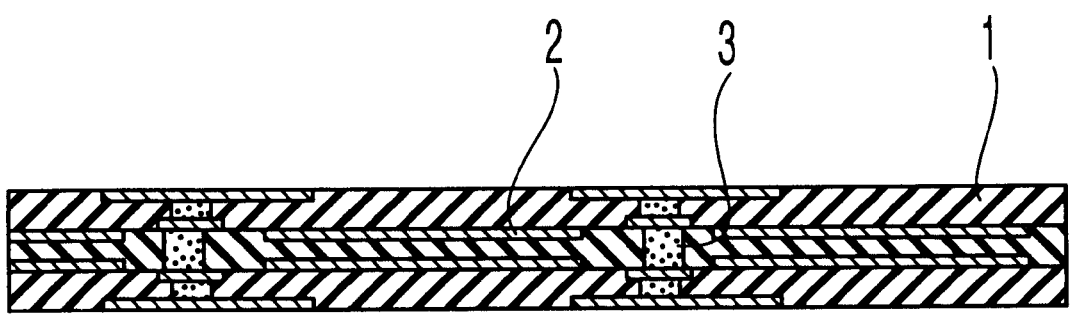
FIG. 1 is a schematic view for illustrating the multilayer wiring board of the invention.

The present invention is described in detail below.

In the present invention, a curable sheet for circuit transfer is formed of a resin-containing insulating material, more specifically, is formed of a thermosetting polyphenylene ether resin composition comprising Components (A), (B), (C) and (D) or Components (A), (B), (C), (D) and (E).

Component (A) to be used in the invention is prepared by reacting a polyphenylene ether resin with an unsaturated carboxylic acid or acid anhydride.

The polyphenylene ether resin to be used in the invention is represented by the following formula (1):

(1)

wherein, m stands for an integer of 1 to 6, J represents a polyphenylene ether chain substantially formed of a unit represented by the following formula A:

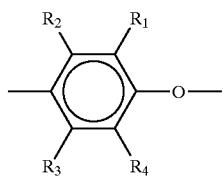
(A)

(wherein $R_1$ to $R_4$ each independently represents a lower alkyl group, an aryl group, a haloalkyl group, a halogen atom or a hydrogen atom); and Q represents a hydrogen atom when m stands for 1 and represents a residue of a polyfunctional phenol compound having, in one molecule thereof, 2 to 6 phenolic hydroxyl groups and a polymerization-inactive substituent at the ortho and para positions of the phenolic hydroxyl group.

Examples of the lower alkyl group as $R_1$ to $R_4$ in the formula A include methyl, ethyl, n-propyl, isopropyl, n-butyl and isobutyl groups, those of the aryl group include phenyl group and those of the halogen atom include bromine and chlorine. As typical examples of Q in the formula (1), mentioned may be a group of compounds represented by the following four structural formula units:

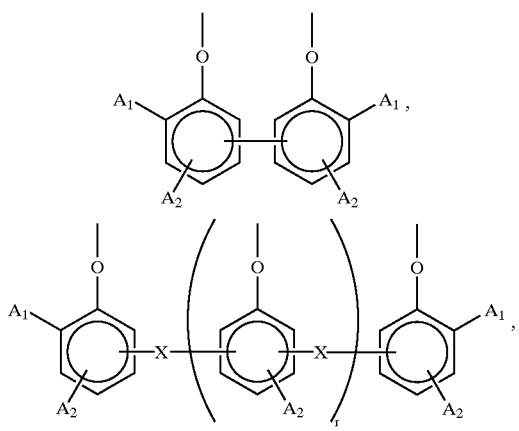

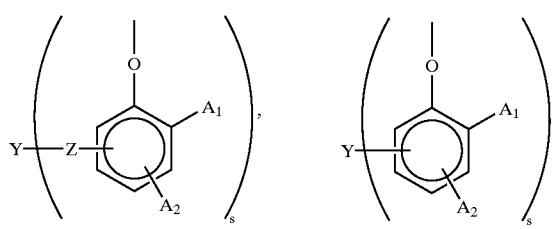

wherein, $A_1$ and $A_2$ are the same or different and each independently represents a linear $C_{1-4}$ alkyl group; X represents an aliphatic hydrocarbon residue or substituted derivative thereof, an aralkyl group or substituted derivative thereof, oxygen, sulfur, a sulfonyl group or a carbonyl group; Y represents an aliphatic hydrocarbon residue or substituted derivative thereof, an aromatic hydrocarbon residue or substituted derivative thereof, or an aralkyl group or substituted derivative thereof; Z represents oxygen, sulfur, a sulfonyl group or a carbonyl group; any one of $A_2$ and two phenyl groups directly bonded thereto, $A_2$ and X, $A_2$ and Y and $A_2$ and Z is bonded at the ortho or para position of the phenolic hydroxyl group; r stands for an integer of 0 to 4; and s stands for an integer of 2 to 6.

The following are the specific examples of them.

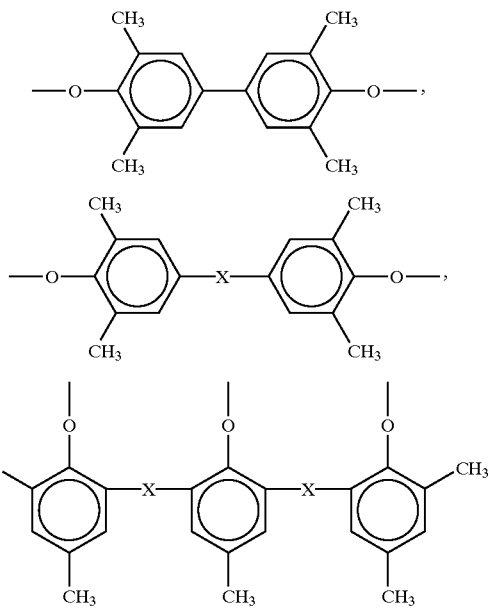

wherein X stands for

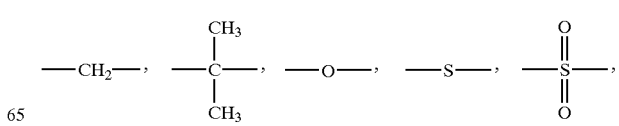

-continued

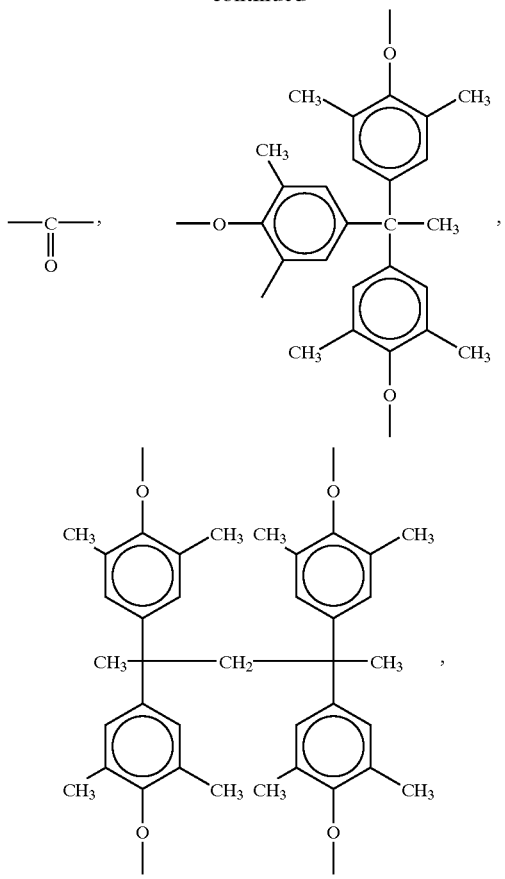

In the formula (1), the polyphenylene ether chain represented by J may contain, in addition to the unit represented by the formula A, a unit represented by the formula (B).

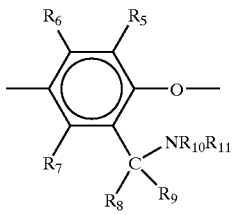

(B)

wherein, $R_5$ to $R_{11}$, each independently represents a hydrogen atom, a halogen atom, a lower alkyl group, an aryl group or a haloalkyl group with the proviso that $R_{10}$ and $R_{11}$ do not represent a hydrogen atom at the same time.

Examples of the unit of the formula B include:

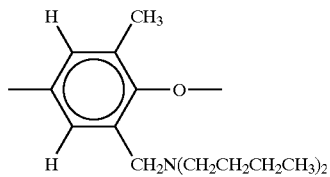

Preferred examples of the polyphenylene ether resin of the formula (1) to be used in the invention include poly(2,6-dimethyl-1,4-phenylene ether) available by homopolymerization of 2,6-dimethylphenol, a styrene graft copolymer of poly(2,6-dimethyl-1,4-phenylene ether), a copolymer of 2,6-dimethylphenol and 2,3,6-trimethylphenol, a copolymer of 2,6-dimethylphenol and 2,6-dimethyl-3-phenylphenol, and a polyfunctional polyphenylene ether resin available by the polymerization of 2,6-dimethylphenol in the presence of a polyfunctional phenol compound represented by the following formula:

$$Q-[H]_m$$

wherein, Q represents a residue of a polyfunctional phenol compound having, in one molecule thereof, 2 to 6 phenolic hydroxyl groups and a polymerization-inactive substituent at the ortho and para positions of the phenolic hydroxyl group; and m stands for an integer of 2 to 6. Specific examples include copolymers containing the unit of each of the formulas A and B as disclosed in JP-A-63-301222 and JP-A-1-297428 (the term "JP-A" as used herein means an "unexamined published Japanese patent application") (the term "JP-A" as used herein means an "unexamined published Japanese patent application).

With regards to the molecular weight of the polyphenylene ether resin as described above, preferred is that having an intrinsic viscosity ηsp/C ranging from 0.1 to 1.0 as measured at 30° C. in a 0.5 g/dl of a chloroform solution.

Examples of the unsaturated carboxylic acid or acid anhydride to be used in the invention include acrylic acid, methacrylic acid, maleic anhydride, fumaric acid, itaconic acid, itaconic anhydride, glutaric anhydride and citraconic anhydride, with maleic anhydride and fumaric acid being most preferred.

The reaction between the polyphenylene ether resin and the unsaturated carboxylic acid or acid anhydride is usually effected by heating within a temperature range of from 100 to 390° C. The reaction may be conducted in the presence of a radical reaction initiator. Either of the solution method or melt mixing method can be employed, but the latter one using an extruder is convenient and suited for the object of the invention.

The unsaturated carboxylic acid or acid anhydride is usually added in an amount of 0.01 to 5.0 parts by weight, preferably 0.1 to 3.0 parts by weight based on 100 parts by weight of the polyphenylene ether resin.

Triallyl isocyanurate and triallyl cyanurate to be used as Component (B) in the invention are trifunctional monomers represented by the following formulas, respectively:

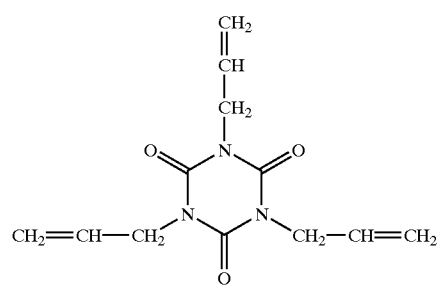

-continued

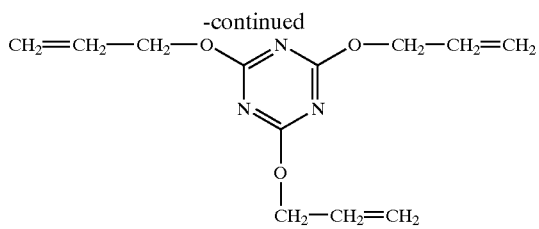

In the invention, triallyl isocyanurate and/or triallyl cyanurate exhibit effects as a plasticizer and a crosslinking agent.

The hydrogenated block copolymer to be used as Component (C) in the invention is available by hydrogenating a block copolymer having at least one Polymer block A mainly comprising an aromatic vinyl compound and at least one Polymer block B mainly comprising a conjugated diene compound, for example, that obtained by hydrogenating the block copolymer of an aromatic vinyl compound and a conjugated diene compound having any one of the below-described structures.

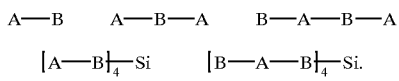

The hydrogenated block copolymer to be used in the invention usually contains 5 to 85 wt. %, preferably 10 to 70 wt. % of an aromatic vinyl compound. Next, the block structure of it will be described. Polymer block A mainly comprising an aromatic vinyl compound has a polymer block structure formed solely of the aromatic vinyl compound or a copolymer block structure formed of at least 50 wt. %, preferably at least 70 wt. % of the aromatic vinyl compound and a hydrogenated conjugated diene compound, while Polymer block B mainly comprising a hydrogenated conjugated diene compound has a polymer block structure solely formed of the hydrogenated conjugated diene compound or a copolymer block structure formed of at least 50 wt. %, preferably at least 70 wt. % of the hydrogenated conjugated diene compound and an aromatic vinyl compound. In these Polymer block A formed mainly of an aromatic vinyl compound and Polymer block B formed mainly of a hydrogenated conjugated diene compound, the hydrogenated conjugated diene compound or aromatic vinyl compound may be distributed, in the molecular chain of each of Polymer blocks, in the random form, tapered form (wherein the monomer component increases or decreases along the molecular chain) or partially blocked form or any combination thereof. When the number of each of Polymer block A formed mainly of the aromatic vinyl compound and Polymer block B formed mainly of the hydrogenated conjugated diene compound amounts two or more, these plural Polymer blocks A or B may have the same structure or a different structure.

Examples of the aromatic vinyl compound constituting the hydrogenating block copolymer include styrene, α-methylstyrene, p-methylstyrene, vinyltoluene and p-tertiary butylstyrene. The above-exemplified compounds may be used either singly or in combination. Among them, styrene is most preferred.

Examples of the unhydrogenated conjugated diene compound to be constituting the hydrogenated conjugated diene compound include butadiene, isoprene, 1,3-pentadiene and 1,3-dimethyl-1,3-butadiene. The above-exemplified compounds may be used either singly or in combination. Among them, butadiene, isoprene and combination thereof are preferred.

Although no particular limitation is imposed on the number-average molecular weight of the hydrogenated block copolymer of the invention having the above-described structure, that having a number-average molecular weight of 5000 to 1000000, preferably 10000 to 500000, more preferably 30000 to 300000 can be employed. Moreover, the molecular structure of the hydrogenated block copolymer may be linear, branched or radial or any combination thereof.

For the preparation of such a block copolymer, any preparation process can be employed insofar as it is capable of preparing a block copolymer having the above-described structure. The hydrogenated block copolymer to be used in the invention can be prepared, for example, by synthesizing the block copolymer of an aromatic vinyl compound and a conjugated diene compound in an inert solvent in the presence of a lithium catalyst in accordance with the process as described in JP-B-40-23798 (the term "JP-B" as used herein means an "examined published Japanese patent publication"); and then, hydrogenating the resulting copolymer in the presence of a hydrogenating catalyst in an inert solvent in accordance with the process as described in JP-B-42-8074 or JP-B-43-6636, especially JP-B-59-133203 or JP-B-60-79005. Upon preparation, Copolymer block B formed mainly of a conjugated diene compound can be morphologically converted into the corresponding olefinic compound polymer block by hydrogenating at least 80 wt. % of the aliphatic double bond based on the conjugated diene compound in the block copolymer of an aromatic vinyl compound and a conjugated diene compound. Although no particular limitation is imposed on the hydrogenation ratio of the aromatic double bond based on Polymer block A mainly comprising an aromatic vinyl compound and if necessary, the aromatic double bond based on the aromatic vinyl compound copolymerized in Polymer block B formed mainly of the conjugated diene compound, the hydrogenation ratio not higher than 20 wt. % is preferred.

Among the above-described three components, that is, Component (A) which is a reaction product of a polyphenylene ether resin and an unsaturated carboxylic acid or acid anhydride, Component (B) which is triallyl isocyanurate and/or triallyl cyanurate, and Component (C) which is a hydrogenated block copolymer available by hydrogenating a block copolymer formed of Polymer block A mainly comprising at least one aromatic vinyl compound and Polymer block B mainly comprising at least one conjugated diene compound, Component (A) is added in an amount of 45 to 55 parts by weight, preferably 48 to 52 parts by weight and Component (B) is added in an amount of 55 to 45 parts by weight, preferably 52 to 48 parts by weight, each based on 100 parts by weight of the total of these Components (A) and (B). At an amount of Component (B) less than 45 parts by weight, sufficient adhesion properties necessary for transfer are not available upon thermal softening of the resin and transfer of a wiring circuit layer made of a metal foil from a transfer base material to an insulating layer, leading to a transfer failure. Amounts exceeding 55 parts by weight, on the other hand, soften the resin too much and excessively increases its fluidity, causing misregistration of the wiring transferred to the insulating layer.

Component (C) is added in an amount of 25 to 35 parts by weight, preferably 27 to 33 parts by weight based on 100 parts by weight of the total of Components (A) and (B). At an amount of Component (C) less than 25 parts by weight, the uncured material has low strength, which causes inconveniences such as tearing of the material upon handling. At an amount exceeding 35 parts by weight, on the other hand, sufficient adhesion properties necessary for transfer are not available upon thermal softening of the resin and transfer of a wiring circuit layer made of a metal foil from a transfer base material to an insulating layer, leading to transfer failure.

In the invention, an inorganic filler is added for the purpose of improving the strength of the insulating layer or wiring board, reducing the thermal expansion coefficient and imparting the insulating layer with good thermal conductivity. The term "inorganic filler" to be used as Component (D) of the invention means ordinarily employed inorganic fillers and does not include so-called reinforced fibers such as glass woven fabric and resin nonwoven fabric. Specific examples include $SiO_2$, $Al_2O_3$, $ZrO_2$, $TiO_2$, AlN and SiC. The inorganic filler is in the form of substantially spherical powder having an average particle size of preferably 20 $\mu$m or less, more preferably 10 $\mu$m or less and most preferably not larger than 7 $\mu$m but at least 1 $\mu$m. In addition, inorganic fillers in the fibrous form having an average aspect ratio of 2 or more, particularly 5 or more can be employed. Coarse particles having an average particle size of 20 $\mu$m or larger tend to inhibit circuit transfer, while particles having an average particle size of 1 $\mu$m or less increase the viscosity of the varnish, making it difficult to sheet formation which will be described later. Component (D) is added in an amount of 20 to 80 vol. %, preferably 35 to 55 vol. % relative to the thermosetting polyphenylene ether resin composition. Amounts less than 20 vol. % cause lowering in the strength and heightening of the thermal expansion coefficient of the resulting insulating layer or multilayer wiring board so that they are unsatisfactory. Amounts exceeding 80 vo. %, on the other hand, cause breakage of the sheet, thereby causing inconveniences upon sheet formation which will be described later.

In the invention, it is preferred to add a brominated flame retardant as Component (E) to the thermosetting polyphenylene ether resin composition with a view to further improving the flame retardancy of the insulating layer or the whole wiring board. The brominated flame retardant to be used as Component (E) of the invention can be added in an amount within a range not impairing its original performance. Component (E) is added in an amount of 10 to 30 parts by weight, preferably 15 to 25 parts by weight, based on 100 parts by weight of the total of Components (A) and (B) to impart the wiring board with sufficient flame retardancy. Typical examples of the brominated flame retardant include, but not limited thereto, ethylene bis-tetrabromophthalimide, ethylene bis-pentabromobenzene, 2,4,6-tribromophenol acrylate, tribromophenol ethoxyacrylate, bisphenol A diethoxylate dimethacrylate, tribromostyrene, pentabromobenzyl monoacrylate, N-tribromophenyl maleimide, hexabromobenzene and brominated polystyrene.

The present inventors found that impurities contained in the brominated flame retardant induce oxidation of the surface of the metal powder in a conductive paste constituting a wiring conductor for forming a wiring circuit layer or a via-hole conductor and increases variations in the resistance of the conductor, thereby tending to impair long-term stability of the multilayer wiring board. The brominated flame retardant is therefore preferred to contain fewer amounts of impurities. In Component (E) of the invention, the amounts of sodium bromide (NaBr) and bromine ($Br_2$) contained as impurities are preferred to be 50 ppm or less and 100 ppm or less, respectively. When NaBr or $Br_2$ is contained as impurities in an amount exceeding 50 ppm or 100 ppm, respectively, the flame retardant is preferably synthesized into another flame retardant or purified in order not to damage the long-term stability of the resulting multilayer wiring board. Even if the impurities fall within the above-described range, synthesis or purification of the flame retardant is preferably conducted for removal of NaBr and $Br_2$ to improve its purity.

When a brominated flame retardant containing, as impurities, NaBr in an amount exceeding 50 ppm or $Br_2$ in an amount exceeding 100 ppm is employed as Component (E), the surface of metal powder such as copper powder contained in a conductive paste used for the formation of a wiring conductor of the resulting multilayer wiring board or for the formation of a via-hole conductor is oxidized under a high temperature shelf test conducted at 130° C. or higher, resulting in inconveniences such as an increase in the resistivity of the conductor.

The curable sheet of the invention for circuit transfer is available by converting the thermosetting polyphenylene ether resin composition of the invention into the corresponding varnish in an aromatic hydrocarbon solvent such as toluene or xylene and then forming the resulting varnish into a sheet by the doctor blade method and then removing the solvent by drying.

The curable composite material to be used as an inner layer of the multilayer wiring board of the invention can be obtained by converting a polyphenylene ether resin composition containing (A) a reaction product of a polyphenylene ether resin and an unsaturated carboxylic acid or acid anhydride and (B) triallyl isocyanurate and/or triallyl cyanurate, the contents of Components (A) and (B) being 45 to 55 parts by weight and 55 to 45 parts by weight, each based on 100 parts by weight of the total of Components (A) and (B), into the corresponding varnish in an aromatic hydrocarbon solvent such as toluene or xylene, impregnating reinforced fibers such as glass woven fabric or resin nonwoven fabric with the resulting varnish, and then removing the solvent by drying.

Component (B) in the polyphenylene ether resin composition to be used for the preparation of the curable composite material is added in an amount of 55 to 45 parts by weight based on 100 parts by weight of the total of Components (A) and (B). At an amount of Component (B) less than 45 parts by weight, sufficient adhesion properties necessary for transfer are not available upon thermal softening of the resin and transfer of a wiring circuit layer made of a metal foil from a transfer base material to an insulating layer and transfer failure occurs. Amounts exceeding 55 parts by weight, on the other hand, cause excessive softening of the resin, thereby increasing its fluidity too much, leading to the misregistration of the wiring transferred to the insulating layer.

As a flame retardant to be added to the polyphenylene ether resin composition to be used for the preparation of the curable composite material, the above-described brominated flame retardants usable for the curable sheet can be used in an amount within a range not damaging their original performance.

The thermosetting polyphenylene ether resin composition or polyphenylene ether resin composition of the invention is cured by the crosslinking reaction caused by heating means. Upon curing, it is possible to lower the reaction temperature or add a radical initiator for promoting the crosslinking reaction of an unsaturated group.

The radical initiator to be used in the thermosetting polyphenylene ether resin composition or polyphenylene ether resin composition of the invention is added in an amount of 0.1 to 10 parts by weight, preferably 0.1 to 8 parts by weight, based on 100 parts by weight of the total of Components (A) and (B).

Typical examples of the radical initiator include, but not limited thereto, peroxides such as benzoyl peroxide, cumene hydroperoxide, 2,5-dimethylhexane-2,5-dihydroperoxide, 2,5-dimethyl-2,5-di(t-butylperoxy)hexyne-3, di-t-butyl peroxide, t-butylcumyl peroxide, α,α-bis(t-butylperoxy-m-isopropyl)benzene, 2,5-dimethyl-2,5-di(t-butylperoxy) hexane, dicumyl peroxide, di-t-butylperoxy isophthalate, t-butylperoxy benzoate, 2,2-bis(t-butylperoxy)butane, 2,2-bis(tbutylperoxy)octane, 2,5-dimethyl-2,5-2,5-di (benzoylperoxy)hexane, di(trimethylsilyl)peroxide and trimethylsilyl triphenylsilyl peroxide.

To the thermosetting polyphenylene ether resin composition or polyphenylene ether resin composition of the invention, it is possible to add, in order to impart the composition with performance desired for satisfying its individual application, a filler or additive in an amount within a range not damaging its original performance. For example, a phosphorus flame retardant or flame retardant assistant such as $Sb_2O_3$ or $NbSbO_3.1/4H_2O$ can be used in combination to further improve the flame retardancy.

Examples of the metal foil to be used for the formation of the wiring circuit layer of the invention include copper foil and aluminum foil, with copper foil being most preferred.

The wiring circuit layer made of a metal foil is obtained by forming a wiring pattern on a transfer base material, which has the metal foil adhered thereto, by the photoresist method and etching and then transferring the pattern to an insulating layer. This wiring circuit layer preferably has a thickness of at least 0.05 time, particularly at least 0.1 time the thickness of the insulating layer. This thickness determines a filling ratio of the via-hole conductor in the compression step which will be described below. The thicker the metal foil used for the wiring circuit layer, the filling ratio of the through-hole conductor can be heightened. When the thickness of the metal foil is less than 0.05 time, the filling ratio of the via-hole conductor is not sufficient. Too thick metal foil cannot be embedded in an insulating layer easily and in addition, happens to cause deformation of a substrate when a plurality of insulating layers are stacked. In consideration of the above-described points, 0.25 time or so is considered appropriate as the upper limit. Pressure is applied to a via-hole conductor to embed a wiring circuit layer inside of the insulating layer and at the same time, the via-hole conductor is compressed under pressure. The pressure to be applied here is preferably 1 to 200 $kg/cm^2$, more preferably 20 to 70 $kg/cm^2$.

As metal powder to be incorporated in a conductive paste filled in a via-hole for the formation of a via-hole conductor of the invention, at least one selected from the group consisting of copper, aluminum, gold and silver is desired, with copper powder, copper-containing alloy powder and copper powder plated with silver are most desired. In some cases, a high-resistance metal such as Ni—Cr alloy may be mixed or alloyed for the regulation of the resistance of the circuit.

As a resin component to be added to the conductive paste filled in a via-hole, known thermosetting resins can be employed, with an epoxy resin being preferred. The epoxy resin containing a solvent may be used, but solvent-free liquid epoxy resin is preferred for preventing the substrate from expanding during a stacking and curing step.

In the insulating layer formed of the curable sheet formed from the thermosetting polyphenylene ether resin composition having the above-described composition, a via-hole conductor can be suitably compressed under pressure. Upon compression of the via-hole conductor under pressure, it is preferred to add, among the three components of Component (A), Component (B) and Component (C), the blending ratio of Component (A) and Component (B) is preferably 45 to 55 parts by weight of Component (A) and 55 to 45 parts by weights of Component (B), and more preferably 48 to 52 parts by weight of Component (A) and 52 to 48 parts by weight of Component (B), each based on 100 parts by weight of the total of the Components (A) and (B).

At an amount of Component (B) less than 45 parts by weight, it tends to be difficult to thermally soften the resin and compress the via-hole conductor under pressure. Amounts exceeding 55 parts by weight, on the other hand, excessively soften the resin and increase its fluidity, thereby causing leakage of the paste of the via-hole conductor, resulting in difficulty in easily compressing the via-hole conductor under pressure.

Component (C) is added in an amount of 25 to 35 parts by weight, preferably 27 to 33 parts by weight, based on 100 parts by weight of the total of Components (A) and (B). At an amount of Component (C) less than 25 parts by weight, the uncured material has low strength, causing inconveniences such as tearing of the material upon compression of the via-hole conductor under pressure. At an amount exceeding 35 parts by weight, on the other hand, a pressure is not applied effectively to the via-hole conductor owing to thermal softening of the resin but is dispersed all over the insulating layer, which tends to increase the deformation of the substrate.

Next, the invention is described referring to accompanying drawings below.

FIG. 1 is a schematic cross-sectional view illustrating the multilayer wiring board of the invention. The multilayer wiring board of the invention is formed of a plurality of insulating layers 1 stacked one after another. Between the insulating layers 1 or the surface of the insulating layer, a wiring circuit layer 2 made of a metal foil is formed. The wiring circuit layer is embedded in the surface of the insulating layer. Between the wiring circuit layers 2, a via-hole conductor 3 is formed. The desired number of via-hole conductor(s) 3 is formed at the desired position.

The multilayer wiring board of the invention is obtained by filling a conductive paste in a via-hole to form the via-hole conductor 3 and, then forming a wiring circuit layer 2 to be connected with the via-hole conductor 3 by transfer from a transfer base material having a metal-foil-made wiring circuit layer formed thereover.

Figure 2:
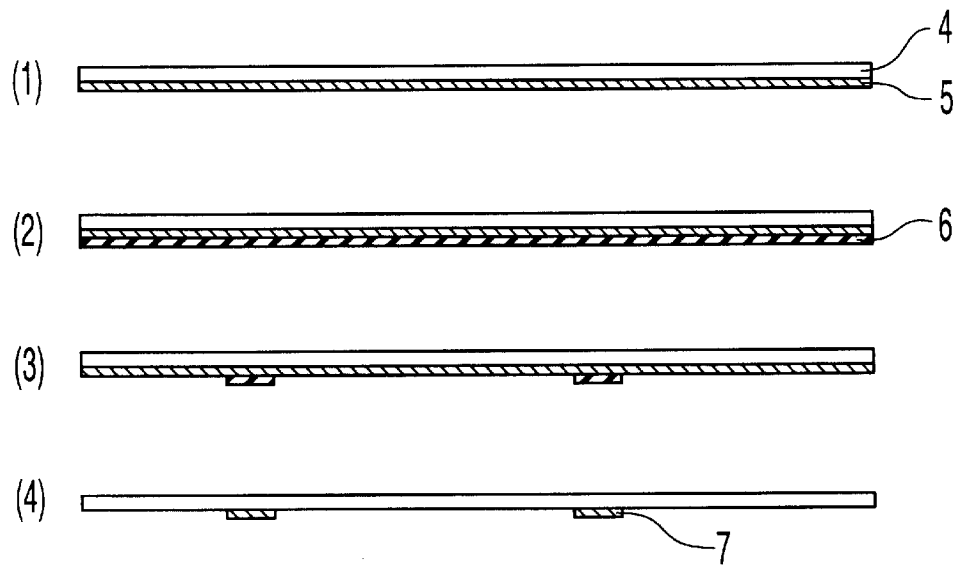
FIG. 2(a) schematically illustrates the steps for the production of a transfer base material having thereon a wiring circuit layer made of a metal foil.
FIG. 2(b) schematically illustrates the steps for the production of a wiring layer, as one unit, made of an insulating layer 1, a via-hole conductor 3 and a wiring circuit layer 2 according to the invention.
Figure 2:
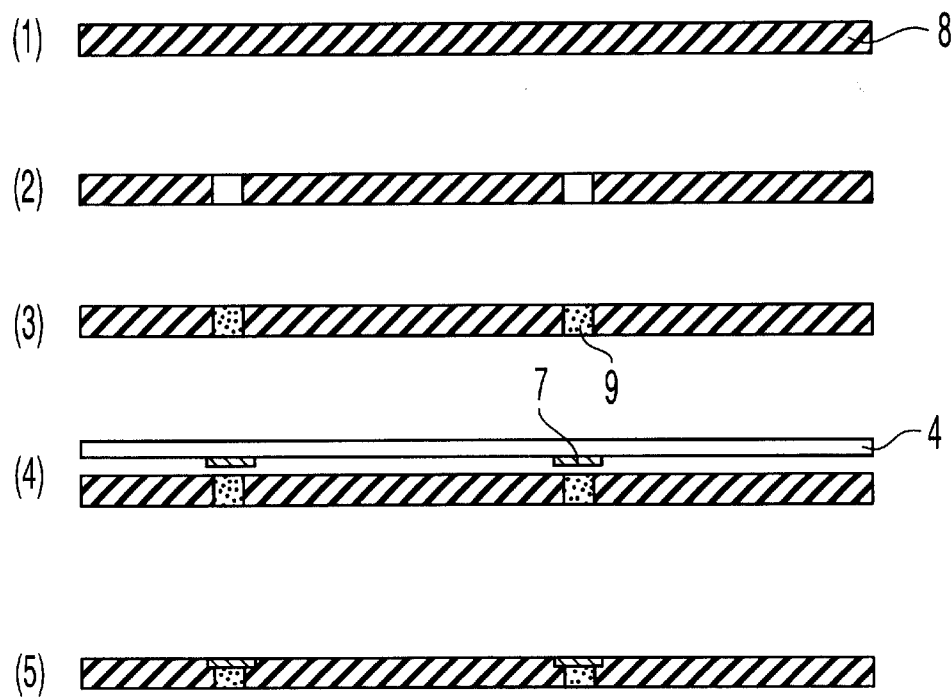
Figure 3:
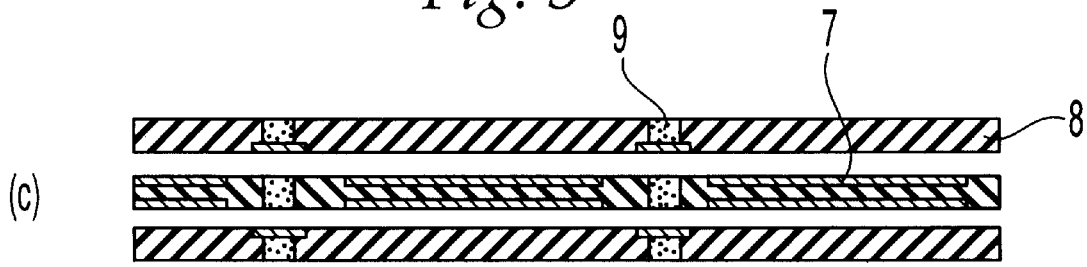
FIG. 3(c) illustrates the step for aligning the insulating layers each having the wiring circuit layer and via-hole conductor and stacking them temporarily.
FIG. 3(d) illustrates the step for bonding, under pressure, the transfer base material having a metal-foil wiring circuit layer to the surface of the temporarily stacked insulating layers.
FIG. 3(e) illustrates the step for releasing the resulting transfer base material, thereby forming an uncured multilayer wiring board.
FIG. 3(f) illustrates the step for adhering a heat-resistant film onto the uncured multilayer wiring board and carrying out simultaneous curing to form a multilayer structure.
Figure 3:
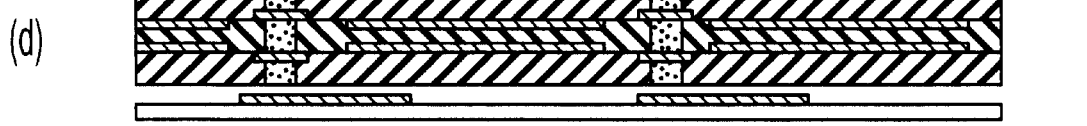
Figure 3:
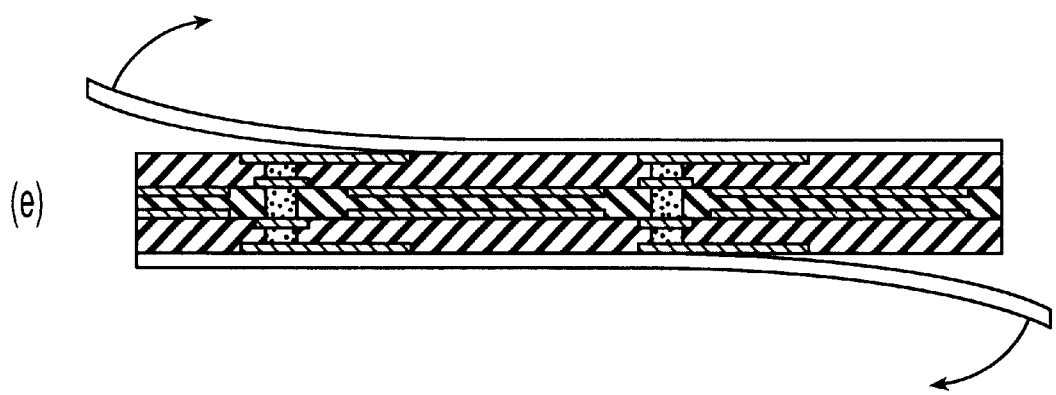
Figure 3:
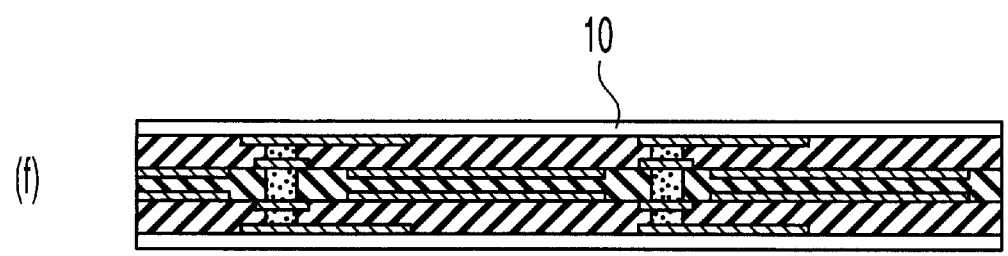

In the next place, a process for producing a wiring layer unit formed of the insulating layer 1, via-hole conductor 3 and wiring circuit layer 2 and a process for forming a multilayer structure from this unit by curing in one step will be described based on the step diagrams as shown in FIGS. 2 and 3.

As illustrated in FIG. 2(a)(1), a metal foil 5 adhered to a transfer base material 4 is prepared in advance. As this transfer base material 4, that obtained by applying an acid-proof alkali-proof adhesive having an adhesive power of 20 to 500 g/cm$^2$ to a film of 100 to 20 $\mu$m thick prepared, for example, from polyethylene terephthalate (PET) or polyethylene naphthalate (PEN) is preferably employed. The metal foil 5 is adhered to the base material by applying an adhesive onto the surface of a PET film having a thickness of about 30 $\mu$m, followed by adhesion thereto of a copper foil of about 12 $\mu$m thick. As illustrated in FIG. 2(a)(2), a dry film resist 6 is adhered to this metal foil 5. Then, as illustrated in (3), a circuit is formed by exposure of the dry film resist 6 to light, followed by development. As illustrated in (4), the metal foil 5 is etched and the dry film resist 6 is peeled therefrom, whereby a transfer base material having a wiring circuit layer 7 formed on the surface is obtained.

As illustrated in FIG. 2(b)(1), a curable sheet (insulating layer) 8 is formed by adding a solvent to a thermosetting polyphenylene ether resin composition and then forming the resulting mixture into a sheet by the doctor blade method. Then, as illustrated in (2), a thorough-hole is formed at the desired position of this insulating layer 8 by punching or laser processing. As illustrated in (3), a conductive paste is filled in the thus-processed through-hole to form a via-hole conductor 9. Then, as illustrated in (4), a circuit is transferred by aligning the transfer base material 4, which has the wiring circuit layer 7 formed thereon, on the surface of the insulating layer having the via-hole conductor formed therein, and applying a pressure to the wiring circuit layer disposed at the end of the via-hole conductor to embed the wiring circuit layer in the insulating layer. This step makes it possible to compress the conductive paste, increases the density of the via-hole conductor and reduces the resistance of the via-hole. Then, as illustrated in (5), the transfer base material 4 is peeled to form, at least one exposed end of the via-hole conductor in the insulating layer, the wiring circuit layer made of a metal foil, whereby a wiring layer unit equipped with the wiring circuit layer 7 connected with the via-hole conductor 9 can be formed.

As illustrated in FIG. 3(c), a plurality of insulating layers having the wiring circuit layer 7 and via-hole conductor 9 are aligned and temporarily stacked one after another.

As illustrated in FIG. 3(d), the transfer base material 4, which has been formed in FIG. 2(a) to have the wiring circuit layer 4 formed thereover, are stacked over the surface of the first insulating layer having the via-hole conductor 9 formed therein and they are bonded under pressure to transfer the wiring circuit layer to the surface of the insulating layer.

As illustrated in FIG. 3(e), the transfer base material is peeled to form an uncured multilayer wiring board.

As illustrated in FIG. 3(f), a heat-resistant, releasable film 10 is closely adhered on each of the both sides of the wiring board thus produced, followed by simultaneous curing by a hot press, whereby a multilayer wiring substrate as illustrated in FIG. 1 can be formed.

In the above-described steps, since the insulating layers of the invention are adhesive under an uncured condition so that their stacking can be conducted without taking any particular means for adhesion. After completion of stacking, all the insulating layers may be cured simultaneously by heating and/or pressurizing means such as hot press or autoclave.

A multilayer wiring board having, as an inner layer, a layer comprising a curable composite material layer and a wiring circuit layer can also be produced by forming, in a similar manner to the curable sheet, a wiring circuit layer on one side or both sides of a sheet made of a curable composite material obtained by the above-described process, carrying out stacking so that this layer will be an inner layer and then curing.

By such a production process, use of a transfer base material makes it possible to conduct formation of the wiring circuit layer and stacking of insulating layers at the same time so that the time or the number of the steps required for the production can be reduced compared with the build-up process.

EXAMPLES

The invention will be described in greater detail with reference to the following examples, but the invention should not be construed as being limited thereto.

The below-described components were employed in the following Examples.

Modified polyphenylene ether Resin

At room temperature, 100 parts by weight of poly(2,6-dimethyl-1,4-diphenylene ether) having a viscosity $\eta$sp/c of 0.40 as measured at 30° C. in 0.5 gr/dl of a chloroform solution was dry blended with 1.5 parts by weight of maleic anhydride, followed by extrusion through a twin-screw extruder under the conditions of a cylinder temperature of 300° C. and screw rotational frequency of 230 rpm. The reaction product was found to have a viscosity $\eta$sp/c of 0.43 as measured at 30° C. in 0.5 gr/dl of a chloroform solution.

Polymerization Initiator 2,5-Dimethyl-2,5-di(t-butylperoxy)hexyne-3 ("Perhexyne 25B", product of NOF Corporation)

Silica

Spherical silica ("FB-6S", trade name; product of Denki Kagaku Kogyo Kabushiki Kaisha)

Hydrogenated Block Copolymer

Hydrogenated styrene-butadiene-styrene block copolymer ("Tuftec H1285", trade name; product of Asahi Chemical Industry Co., Ltd.)

Flame Retardant

Used as a brominated flame retardant were ethylene bis-tetrabromophthalimide ("Saytex BT-93W", trade name; product of Albemarle Corporation), ethylene bis-pentabromobenzene ("Saytex 8010", trade name; product of Albemarle) and purified "Saytex 8010" obtained by stirring Saytex 8010 in a 1:9 (weight ratio) solvent mixture of acetone and distilled water at room temperature and then purifying through filtration. Analysis of NaBr and $Br_2$ contained as impurities in each of the brominated flame retardants was conducted as described below. First, the content of NaBr was determined by subjecting an aqueous solution, which had been obtained by impregnating the brominated flame retardant in acetone and distilled water, to ion chromatography (apparatus: "Dionex 2010i", trade name; manufactured by Dionex Corporation). The content of $Br_2$ was determined by immersing the brominated flame retardant in a mixed solution of bromobenzene, a 10% potassium iodine solution and a 0.5% starch solution and titrating the $Br_2$ thus eluted with a 0.002N sodium thiosulfate solution. Analysis results are shown in Table 1.

TABLE 1

| Brominated flame retardant | Content of NaBr | Content of $Br_2$ |
|---|---|---|
| Saytex BT-93W | 1 ppm | 23 ppm |
| Saytex 8010 | 51 ppm | 184 ppm |
| Purified Saytex 8010 | 3 ppm | 96 ppm |

Example 1

The above-described modified polyphenylene ether resin, hydrogenated block copolymer, triallyl isocyanurate and, as a bromine flame-retardant, Saytex BT-93W were added, at the composition as shown in Table 2, to toluene of 80° C., followed by stirring for 1 hour to dissolve the former in the latter. A polymerization initiator was added at the composition as shown in Table 2. Then, silica was added at the composition as shown in Table 2 to disperse it in the mixture, whereby the corresponding varnish was prepared. The resulting varnish was applied to a PET film of 100 μm thick by a blade coater, followed by drying in an air oven at 50° C. for 30 minutes. Then, the PET film was peeled, whereby a curable sheet of 100 μm thick was prepared. A through-hole of 0.1 mm in diameter was made in the thus-prepared curable sheet by a $CO_2$ gas laser. A conductive paste containing silver-plated copper particles was filled in the through-hole to form a via-hole conductor.

An adhesive was applied to the surface of a transfer base material made of a polyethylene terephthalate (PET) resin to impart the material with adhesion. Then, a copper foil having a thickness of 12 μm and surface roughness of 0.8 μm was adhered all over the surface. A photoresist was then applied to the resulting copper foil. After development by exposure to light and immersion in a solution of ferric chloride, a not-patterned portion was removed by etching, whereby a wiring circuit layer was formed. The wiring circuit layer thus formed is a minute pattern having a line width of 25 μm and a wiring-to-wiring distance of 25 μm.

The transfer base material having the wiring circuit layer formed thereon was aligned to the curable sheet having the via-hole conductor formed therein and they were adhered under the conditions of 120° C. and 20 $kg/cm^2$ for 30 seconds. By peeling of the transfer base material, a wiring circuit layer made of copper was formed, whereby one wiring layer unit was formed.

In the above-described manner, seven wiring layers, each about 100 μm thick (one of them having wiring circuit layers transferred onto both sides thereof) were prepared. Over each of the both sides of the wiring layer having wiring circuit layers formed on both sides thereof, three wiring layers were aligned and stacked one after another. They were bonded under pressure of 15 $kg/cm^2$ and then, cured by heating at 200° C. for 1 hour, whereby a multilayer wiring board was formed.

As a result of observation of the cross-section of the multilayer wiring board thus formed at the position near the wiring circuit layer or via-hole conductor, it has been found that the wiring circuit layer formed by transfer was embedded in the insulating layer enough to form a flat surface and that the wiring circuit layer and via-hole conductor were connected well. As a result of a continuity test between interconnects, no disconnection was recognized.

Examples 2 to 4

In a similar manner to Example 1 except that the composition ratio of each of the modified polyphenylene ether resin, hydrogenated block copolymer, triallyl isocyanurate, brominated flame retardant, silica and polymerization initiator was changed as shown in Table 2, a multilayer wiring board was produced.

As a result of observation of the cross-section of the multilayer wiring board thus formed at the position near the wiring circuit layer or via-hole conductor, it has been found that the wiring circuit layer formed by transfer was embedded in the insulating layer enough to form a flat surface and that the wiring circuit layer and via-hole conductor were connected well. As a result of the continuity test between interconnects, no disconnection was recognized.

TABLE 2

|  | Example 1 | Example 2 | Example 3 | Example 4 |
|---|---|---|---|---|
| Modified PPE resin (A) | 50 | 45 | 45 | 55 |
| TAIC (B) | 50 | 55 | 55 | 45 |
| Hydrogenated block copolymer (C) | 30 | 35 | 25 | 25 |
| Spherical silica (D) | 50 | 50 | 50 | 50 |
| Flame retardant | 20 | 20 | 20 | 20 |
| Polymerization initiator | 6 | 6 | 6 | 6 |

The unit of each of the above-described components other than spherical silica is parts by weight based on 100 parts by weight of (A)+(B), while that of spherical silica is vol. % based on the whole amount. Modified PPE resin: modified polyphenylene ether resin TAIC: triallyl isocyanurate Example 5

In toluene of 80° C., were dissolved 50 parts of the above-described modified polyphenylene ether resin and 50 parts by weight of triallyl isocyanurate. To the resulting solution, successively added were 25 parts by weight of Saytex 8010 (trade name; product of Albemarle Corporation) as a flame retardant and 6 parts by weight of "Perhexyne 25B" as a polymerization initiator, whereby a varnish formed of the resulting polyphenylene ether resin composition was formed. A glass cloth was impregnated with the varnish, followed by drying in an air oven to form a composite prepreg.

A through-hole was made in the prepreg by a $CO_2$ gas laser. After a conductive paste containing a silver-plated copper powder was filled in the hole as in Examples 1 to 4, a wiring circuit layer made of the copper foil was formed by transfer, whereby one wiring layer unit was obtained.

Three wiring layers were stacked one after another. A curable sheet having the composition similar to that prepared in Example 1 was formed and a through-hole of 40 μm in diameter was made in the sheet by an YAG laser. A conductive paste containing silver-plated copper powder having an average particle size of 2 μm was filled in the hole. The above-prepared transfer base material having the wiring circuit layer formed thereon was aligned with the curable sheet and they were adhered closely at 120° C. and 20 kg/cm² for 30 seconds. With the transfer base material being adhered closely to the curable sheet, the curable sheet was aligned and stacked on both sides of the three-layer laminate which had been prepared in advance, followed by peeling-off of the transfer base material.

A heat resistant release film was adhered to each of the both sides, followed by heating and pressurizing at 200° C. for 1 hour for curing, whereby a multilayer wiring substrate was formed. The pressure applied was 20 kg/cm² in terms of surface pressure.

As a result of observation of the cross-section of the multilayer wiring board thus formed at the position near the wiring circuit layer or via-hole conductor, it has been found that the wiring circuit layer formed by transfer was embedded in the insulating layer enough to form a flat surface and that the wiring circuit layer and via-hole conductor were connected well. As a result of the continuity test between the interconnects, no disconnection was recognized.

Comparative Examples 1 to 5

In a similar manner to Example 1 except for the use of curable polyphenylene ether resin compositions having the components as shown in Table 3, insulating resin sheets were formed. In Comparative Examples 1 and 2, the resin sheets thus obtained were poor in adhesion, the wiring circuit layer was not transferred well and simultaneous stacking was not conducted easily.

In Comparative Examples 3, 4, owing to excessive softening of the resin sheet upon transfer of the wiring circuit layer, the transfer was not conducted well. Upon simultaneous stacking, the interconnect and via-hole were not stable in shape so that their good connection was not available.

The composition in Comparative Example 5 was not suited for the transfer process because formability of the insulating resin sheet was poor and moreover, the resin sheet was not softened sufficiently upon transfer of the wiring circuit layer.

TABLE 3

|  | Comp.Ex.1 | Comp.Ex.2 | Comp.Ex.3 | Comp.Ex.4 | Comp.Ex.5 |
| --- | --- | --- | --- | --- | --- |
| Modified PPE resin A | 70 | 60 | 30 | 50 | 50 |
| TAlC(B) | 30 | 40 | 70 | 50 | 50 |
| Hydrogenated block copolymer C | 30 | 20 | 30 | 50 | 10 |
| Spherical silica (D) | 50 | 40 | 50 | 50 | 50 |
| Flame retardant | 20 | 20 | 20 | 20 | 20 |
| Polymerization initiator | 6 | 6 | 6 | 6 | 6 |

The unit of each of the above-described components other than spherical silica is parts by weight based on 100 parts by weight of (A)+(B), while that of spherical silica is vol. % based on the whole amount. Modified PPE resin: modified polyphenylene ether resin TAIC: triallyl isocyanurate Example 6

In a similar manner to Example 1, a curable sheet was prepared. A through-hole of 0.1 mm in diameter was made in the curable sheet by a $CO_2$ gas laser. A conductive paste containing copper powder was filled in the hole, whereby a via-hole conductor was formed.

In a similar manner to Example 1, a wiring circuit layer made of a copper foil was formed on the curable sheet, whereby a wiring layer of 100 μm thick was formed as one unit. Five layers of the resulting wiring layer were aligned and stacked, bonded under pressure of 20 kg/cm² and then, heated at 200° C. for 1 hour for complete curing, whereby a multilayer wiring board was prepared. As a result of a high-temperature shelf test on the resulting multilayer wiring board at 130° C., it was found that a changing rate in the resistance of the conductor until 1000 hours was 10% or less.

Example 7

In a similar manner to Example 6 except for the use of purified Saytex 8010 as a brominated flame retardant, a multilayer wiring board was prepared. As a result of a high-temperature shelf test on the resulting multilayer wiring board at 130° C., it was found that a changing rate in the resistance of the conductor until 1000 hours was 10% or less.

Example 8

In a similar manner to Example 6 except for the use of unpurified Saytex 8010 as a brominated flame retardant, a multilayer wiring board was prepared. As a result of a high-temperature shelf test on the resulting multilayer wiring board at 130° C., it has been found that a changing rate in the resistance of the conductor until 1000 hours exceeded 10%.

TABLE 4

|  | Example 6 | Example 7 | Example 8 |
| --- | --- | --- | --- |
| Modified PPE resin | 50 parts by weight | 50 parts by weight | 50 parts by weight |
| TAIC | 50 parts by weight | 50 parts by weight | 50 parts by weight |
| Hydrogenated block copolymer | 30 parts by weight | 30 parts by weight | 30 parts by weight |
| Brominated flame retardant | Saytex BT-93W | purified Saytex 8010 | Saytex 8010 |
|  | 20 parts by weight | 20 parts by weight | 20 parts by weight |
| Spherical silica | 50 vol. % | 50 vol. % | 50 vol. % |
| Polymerization initiator | 6 parts by weight | 6 parts by weight | 6 parts by weight |

Since the curable sheet of the invention for circuit transfer has adhesive properties facilitating the circuit transfer, melt properties permitting retention of the circuit position upon curing by heating or pressurization, strength endurable to handling upon processing and properties facilitating the processing of a via-hole for electric connection, the multilayer wiring board of the invention available from the above-described curable sheet for circuit transfer is equipped with precise and high-density wiring circuit. It is therefore suited for use in a semiconductor device package requiring the formation of a minute wiring circuit. The production process of a multilayer wiring board is also industrially useful because it can simplify the stacking step and has high productivity.

The invention also makes it possible to provide a multilayer wiring board having long-term stability under an environmental test and having a high-reliability and high-density wiring circuit by prescribing the content of impurities in a brominated flame retardant contained in a specific thermosetting polyphenylene ether resin composition, and a production process of the multilayer wiring board.

While the present invention has been described in detail and with reference to specific examples thereof, it will be apparent to one skilled in the art that various changes and modifications can be made therein without departing from the spirit and cope thereof.

What is claimed is:

1. A curable sheet for the formation of a wiring circuit layer by circuit transfer from a transfer base material, which sheet comprises a thermosetting polyphenylene ether resin composition comprising:

(A) a reaction product between a polyphenylene ether resin and an unsaturated carboxylic acid or acid anhydride;

(B) triallyl isocyanurate and/or triallyl cyanurate;

(C) a hydrogenated block copolymer obtained by hydrogenation of a block copolymer having at least one polymer block A mainly comprising an aromatic vinyl compound and at least one polymer block B mainly comprising a conjugated diene compound; and (D) an inorganic filler, said composition containing 45 to 55 parts by weight of Component (A), 55 to 45 parts by weight of Component (B) and 25 to 35 parts by weight of Component (C), each based on 100 parts by weight of the total of Components (A) and (B), and containing 20 to 80 vol. % of Component (D).

2. The curable sheet according to claim 1, wherein the thermosetting polyphenylene ether resin composition further comprises (E) a brominated flame retardant in an amount of 10 to 30 parts by weight based on 100 parts by weight of the total of Components (A) and (B) and the brominated flame retardant (E) contains, as impurities, sodium bromide (NaBr) and bromine ($Br_2$) at a weight ratio of 50 ppm or less and 100 ppm or less, respectively.

3. A multilayer wiring board comprising a resin-containing insulating layer and a wiring circuit layer disposed on the surface and/or inside of the insulating layer, wherein said insulating layer is obtained by curing a curable sheet according to claim 1 or 2 and at least a part of the wiring circuit layer is formed by transfer from a transfer base material having thereon a wiring circuit layer comprising a metal foil.

4. The multilayer wiring board according to claim 3, which further comprises a via-hole conductor for electrically connecting adjacent wiring circuit layers, wherein the via-hole conductor is formed by filling a conductive paste in a through-hole, and wherein a wiring circuit layer comprising a metal foil having a thickness of at least 0.05 time the thickness of the insulating layer is embedded in the insulating layer.

5. The multilayer wiring board according to claim 3, which has, inside thereof, an inner layer comprising:

a cured composite material layer obtained by impregnating reinforced fibers with a polyphenylene ether resin composition comprising (A) a reaction product between a polyphenylene ether resin, and an unsaturated carboxylic acid or acid anhydride and (B) triallyl isocyanurate and/or triallyl cyanurate, the contents of Components (A) and (B) being 45 to 55 parts by weight and 55 to 45 parts by weight, respectively, each based on 100 parts by weight of the total of Components (A) and (B); and a wiring circuit layer at least a part of which is formed by transfer from a transfer base material having thereon a wiring circuit layer comprising a metal foil.

6. The multilayer wiring board according to claim 5, which further comprises a via-hole conductor for electrically connecting adjacent wiring circuit layers, wherein said via-hole conductor is formed by filling a conductive paste in a through-hole, and wherein a wiring circuit layer comprising a metal foil having a thickness of at least 0.05 time the thickness of the insulating layer is embedded in each of the insulating layer and cured complex material layer.

* * * * *